Figure 1:
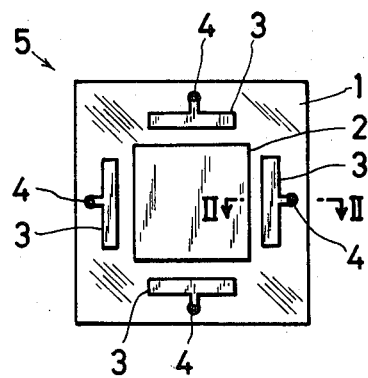

United States Patent [19]

Imahashi

[11] 4,397,078
[45] Aug. 9, 1983

[54] METHOD AND APPARATUS FOR MEASURING A GAP DISTANCE BETWEEN A MASK AND A WAFER TO BE USED IN FABRICATION OF SEMICONDUCTOR INTEGRATED CIRCUITS

[75] Inventor: Issei Imahashi, Yamanashi, Japan

[73] Assignee: Telmec Co., Ltd., Japan

[21] Appl. No.: 289,199

[22] Filed: Aug. 3, 1981

[30] Foreign Application Priority Data

Aug. 11, 1980 [JP] Japan ................ 55-110782

[51] Int. Cl.³ .................. H01L 21/66; H01L 21/68
[52] U.S. Cl. .................................. 29/574; 29/578; 324/61 R
[58] Field of Search ............. 324/61 R, 57 R; 29/574, 29/579, 578

[56] References Cited

U.S. PATENT DOCUMENTS 3,815,020  6/1974  Mayer ........................ 324/61 R
3,843,924 10/1974  Wahlgren .................... 324/61 R

FOREIGN PATENT DOCUMENTS 55-21181  2/1980  Japan ......................... 29/574
55-30823  3/1980  Japan ......................... 29/579
55-71025  5/1980  Japan ......................... 29/574

OTHER PUBLICATIONS

Colclaser: "Microelectronics: Processing and Device Design"–John Wiley, pp. 41-43-1982.

Primary Examiner—Stanley T. Krawczewicz
Assistant Examiner—Jose M. Solis
Attorney, Agent, or Firm—Price, Heneveld, Huizenga & Cooper

[57] ABSTRACT

On a mask to be used in fabrication of semiconductor integrated circuits is formed an electrode outside of an integrated circuit pattern area with the same material as said pattern area in the same thickness as said pattern area, this mask is positioned above a wafer as separated therefrom at a minute gap distance, and the gap distance between the mask and the wafer is measured by detecting an electrostatic capacitance between the electrode and the wafer.

6 Claims, 3 Drawing Figures

METHOD AND APPARATUS FOR MEASURING A GAP DISTANCE BETWEEN A MASK AND A WAFER TO BE USED IN FABRICATION OF SEMICONDUCTOR INTEGRATED CIRCUITS

The present invention relates to a method and an apparatus for measuring a gap distance between a photo-printing mask and a wafer to be used in fabrication of semiconductor integrated circuits.

In the case of carrying out photo-printing on a semiconductor wafer by making use of a mask on which a pattern of semiconductor integrated circuits is formed, it is not desirable for the mask to contact with the wafer. The reason is because if the contact between the mask and the wafer should be made, a layer of photo-sensitive material applied on the wafer surface would partly adhere to the mask, resulting in contamination of the mask, and also the wafer itself would have a partial area where the photo-sensitive material is lost.

Consequently, exposure to light of the wafer is effected while the mask is spaced from the wafer surface. However, in this case, it is necessary to place the mask as close as possible to the wafer, because if the gap distance therebetween is too large, the pattern printed on the wafer through the mask will loss sharpness. As a result of experiment, a numerical value of about 2 microns was attained as the aforementioned gap distance value for satisfying the above requirements.

Generally, in some cases, after a wafer has been prepared as a raw material a warp in the direction of thickness would occur in the wafer, and so, if the entire wafer surface is exposed to light through the mask in one exposure step, in some cases unevenness in sharpness of the exposed pattern would arise.

In addition, a wafer is worked into a product through many times of working, and in the course of working, due to the working such as photo-printing or the like, often the wafer deforms as elongating in the plane of the wafer although the deformation is slight, and therefore, if a pattern is printed in one exposure step on the entire wafer surface, then the exposed pattern may possibly deviate in position from the already formed pattern on the wafer.

Because of the various reasons as described above, at present a method is practiced, in which a wafer surface is divided into a number of small area units, and positioning of a mask and photo-printing through the mask is repeated for each one of the divided small area units. By employing such method, unevenness in pattern sharpness and deviation of photo-printing positions can be reduced to a practically unobjectionable extent.

In the case of placing a mask and a wafer as opposed to each other at a minute gap distance and moving the mask for each exposure as described above, in order to maintain the gap distance always constant whatever position the wafer may be placed, a moving stage for the wafer must be a stage having an extremely high precision and also the surface of the wafer must be finished very precisely so as to have an excellent flatness. These precisions must be held to an extent of 1 micron or less in the case of employing X-rays as a light for exposure. A wafer having its surface finished very precisely so as to have an excellent flatness as described above, is very expensive, and so, it is not practicable.

However, if any means for measuring a gap distance between a mask and a wafer at a high precision is available, then it is only necessary to lower the wafer away from the mask to a safe distance position where there is no risk of contact with the mask before the photo-printing position is displaced, subsequently displace the wafer or the mask to the next photo-printing position, then raise the wafer to bring it close to the mask, and effect exposure when the gap distance between the wafer and the mask has been reduced to a predetermined minute distance. The present invention has been worked out under the above-mentioned background.

It is therefore one object of the present invention to provide a method and an apparatus for measuring a gap distance between a mask and a wafer at a high precision.

Another object of the present invention is to provide a method and an apparatus in which a gap distance between a mask and a wafer can be measured at a high precision even during photo-printing on the wafer through the mask.

Still another object of the present invention is to provide a novel mask which can be conveniently used in precise measurement of a gap distance between a wafer and the mask.

Yet another object of the present invention is to provide an apparatus for measuring a gap distance between a mask and a wafer at a high precision in which a measuring circuit is closed by merely placing a photo-printing mask on a holder therefor.

In order to achieve the aforementioned objects, according to one feature of the present invention, on a mask having a circuit pattern of a semiconductor integrated circuit formed thereon, an electrode is additionally formed outside of the circuit pattern, the mask is placed above a wafer as opposed to each other, and a gap distance between the mask and the wafer is measured by detecting an electrostatic capacitance between the electrode and the wafer.

Figure 2:
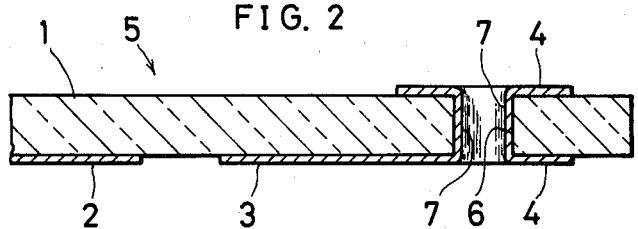
Figure 3:
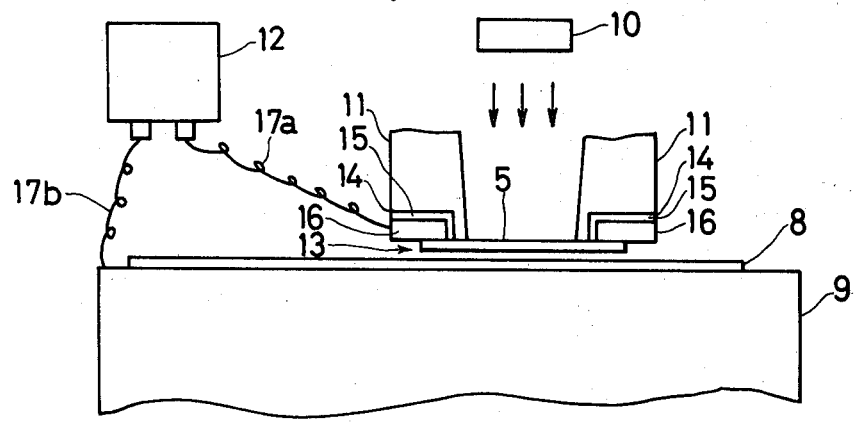

The above-mentioned objects, features and advantages of the present invention will be better understood from the following description of a preferred embodiment thereof taken in conjunction with the accompanying drawings, wherein:

FIG. 1 is a plan view of a mask to be used according to one preferred embodiment of the present invention, FIG. 2 is an enlarged partial cross-section view taken along line II—II in FIG. 1 as viewed in the direction of arrows, and FIG. 3 is a schematic cross-section view showing an outline of an apparatus for measuring a gap distance between a mask and a wafer according to the present invention with the mask and wafer mounted on the apparatus.

Referring now to FIGS. 1 and 2, reference numeral 1 designates a substrate of a mask which is made of quartz, glass or the like. Numeral 2 designates an integrated circuit pattern area, and photo-printing of the pattern on a wafer is effected through this pattern area. Numeral 3 designates an electrode to be used for measuring a gap distance between the mask and the wafer, and numeral 4 designates a lead out portion from the electrode 3. Reference numeral 5 designates generally the whole mask formed in the above-described manner. Numeral 6 designates a through-hole formed in the mask substrate 1, a lining member 7 made of the same material as the electrode 3 is formed along the inner peripheral surface of the through-hole 6, and thereby the electrode 3 is conductively connected to the lead out portion 4 provided on the both sides of the substrate 1.

Next, in FIG. 3, reference numeral 8 designates a semiconductor wafer, numeral 9 designates a chuck for holding the wafer 8, numeral 10 designates a light source or X-ray source for photo-printing, numeral 11 designates a holder for holding the mask 5, and numeral 12 designates an electrostatic capacitance measuring device. In addition, reference numeral 13 designates a gap distance between the mask 5 and the semiconductor wafer 8.

A method for measuring the gap distance 13 will be described in the following. The measurement of the gap distance 13 is affected by detecting an electrostatic capacitance between the electrode 3 and the wafer 8 by means of the electrostatic capacitance measuring device 12. Since the electrostatic capacitance between the electrode 3 and the wafer 8 is uniquely determined as a function of the distance between the mask 5 and the wafer 8, if the electrostatic capacitance is continuously detected even during the photo-printing process, then the gap distance 13 between the mask 5 and the wafer 8 can be always measured. With regard to the method for measuring an electrostatic capacitance, various methods have been heretofore known, and so, detailed description of the method will be omitted here. Whatever known method may be used for measuring the electrostatic capacitance, upon measuring a gap distance of the order of about 2 microns, a variation in the gap distance that is as small as about 0.1 microns can be easily detected.

The mask 5 is generally formed of a substrate 1 and a circuit pattern area 2, normally the substrate 1 is made of insulating material, and the circuit pattern area 2 is often formed of a patterned conductor film by etching, for example, a vapor deposited metal film. Accordingly, the electrode 3 to be used for the above-mentioned measurement purpose can be produced from the same conductor material as the circuit pattern area 2 in the same process as that for producing the circuit pattern area 2, and therefore, there is no need to separately provide a process step of producing an electrode. It is to be noted that the thicknesses of the electrode 3 and the circuit pattern 2 are generally extremely thin such as 0.1 $\mu$m or less, so that the fluctuation in thickness of the electrode 3 and the circuit pattern 2 is very small as compared to the gap distance to be measured, and hence it involves no problem. In addition, since the electrode 3 and the circuit pattern 2 are formed on the same plane, even if the thickness of the above-described substrate 1 should be varied due to replacement of the mask (Normally such type of substrates can be produced so as to have an extremely good flatness, but it is very difficult to equalize the thicknesses of a large number of substrates.), the gap distance measured by means of the aforementioned electrode is always equal to the true gap distance between the circuit pattern 2 and the wafer 8. Accordingly, the operation of making correction of measurement taking into consideration the difference between the gap distance between the electrode 3 and the wafer 8 and the gap distance between the circuit pattern 2 and the wafer 8, becomes unnecessary.

Explaining further the method and apparatus according to the present invention with reference to FIG. 3, at the bottom of the mask holder 11 is formed a notch 14 surrounding the outer periphery of the mask holder 11, an insulator member 15 is fitted in the notch 14, and a contact member 16 is fitted via the insulator member 15 into the notch 14. Reference numeral 17a designates a lead wire for the contact member 16. The other lead wire 17b connects the electrostatic capacitance measuring device 12 via the chuck 9 to the semiconductor wafer 8. When the mask 5 is held at a predetermined position on the holder 11 (for example, the mask 5 being held by vacuum suction), the contact member 16 is just located at a position adapted to contact with the lead out portion 4 of the mask 5, and therefore, by making the mask 5 held by the holder 11, the electrode 3 can be connected to the electrostatic capacitance measuring device 12.

In the method and apparatus according to the present invention as described in detail above, a minute gap distance 13 between the mask 5 and the wafer 8 can be easily and precisely measured. Accordingly, a photo-printing work on the wafer 8 through the mask 5 can be achieved at a high efficiency.

What is claimed is:

1. A method for measuring a gap distance between a mask and a wafer to be used in fabrication of semiconductor integrated circuits, characterized by the steps of forming an electrode on a mask having a pattern of a semiconductor integrated circuit, positioning said mask as spaced from a wafer at a certain gap distance, and measuring said gap distance between said mask and said wafer by detecting an electrostatic capacitance between said electrode and said wafer.

2. An apparatus for measuring a gap distance between a mask and a wafer to be used in fabrication of semiconductor integrated circuits; characterized in that said apparatus comprises a mask consisting of a substrate and a pattern area for a semiconductor integrated circuit and an electrode formed on the outer surface of said substrate; a holder for holding said mask; a chuck for holding said wafer; and an electrostatic capacitance measuring device electrically connected between said electrode formed on said mask and said wafer.

3. A pattern printing apparatus provided with means for measuring a gap distance between a mask and wafer to be used in fabrication of semiconductor integrated circuits; characterized in that said apparatus comprises a mask consisting of a substrate and a pattern area for a semiconductor integrated circuit and an electrode formed on the outer surface of said substrate; a holder for holding said mask; a chuck for holding said wafer; a source of light or X-rays for photo-printing; and an electrostatic capacitance measuring device electrically connected between said electrode formed on said mask and said wafer.

4. An apparatus for measuring a gap distance between a mask and a wafer to be used in fabrication of semiconductor integrated circuits as claimed in claim 2, further characterized in that said electrode is made of the same material as said pattern area for a semiconductor integrated circuit.

5. An apparatus for measuring a gap distance between a mask and a wafer to be used in fabrication of semiconductor integrated circuits as claimed in claim 2, further characterized in that said electrode is formed in the same thickness as said pattern area for a semiconductor integrated circuit.

6. An apparatus for measuring a gap distance between a mask and a wafer to be used in fabrication of semiconductor integrated circuits as claimed in claim 2, further characterized in that said holder includes a contact member adapted to electrically connect said electrode formed on said mask to said electrostatic capacitance measuring device upon holding said mask on said holder.

* * * * *